United States Patent

Peterson

[15] 3,665,323

[45] May 23, 1972

[54] PROPORTIONAL DIGITAL CONTROL FOR RADIO FREQUENCY SYNTHESIZERS

[72] Inventor: Max E. Peterson, Richardson, Tex.

[73] Assignee: Collins Radio Company, Dallas, Tex.

[22] Filed: May 10, 1971

[21] Appl. No.: 141,895

[52] U.S. Cl. ....................328/14, 328/44, 235/92 FQ
[51] Int. Cl. ....................H03b 19/00
[58] Field of Search ....................328/14, 44, 48; 235/92 FQ

[56] References Cited

UNITED STATES PATENTS

| | | | |
|---|---|---|---|
| 3,314,015 | 4/1967 | Simone | 328/14 X |
| 3,331,035 | 7/1967 | Strickholm | 328/14 X |
| 3,464,018 | 8/1969 | Cliff | 328/14 X |
| 3,548,320 | 12/1970 | Roberts et al. | 328/48 X |
| 3,568,069 | 3/1971 | Gabor | 328/14 |

*Primary Examiner*—John S. Heyman
*Attorney*—Warren H. Kintzinger and Robert J. Crawford

[57] ABSTRACT

A proportional digital control system for radio frequency synthesizers using binary coded decimal control to a frequency synthesizer tunable in contiguous small interval increasing or decreasing steps throughout the frequency bandwidth range of operation. A fine tune dial switch circuit generates a two signal output with one a step count signal and the other an up-down control signal generated only upon rotation of the fine tuning dial and with the signal pulse rates thereof a direct function of the rate of fine tune dial turning. The up-down control signal is an up or down signal input to up-down pulse counting to BCD output circuits as determined by phase relation thereof to the step count signal and with the phase determined by direction of fine tune dial turning clockwise for up count and counterclockwise for down count. The up-down counters to BCD are in a chain circuit with carry over circuitry for up-down count transition from one digit location to another that in some equipments is paralleled by supplemental band switching circuits. The BCD outputs of the up-down counter chain circuits are applied to a frequency synthesizer circuit and to readout display device circuits.

12 Claims, 8 Drawing Figures

Patented May 23, 1972

3,665,323

5 Sheets-Sheet 1

Figure 1:
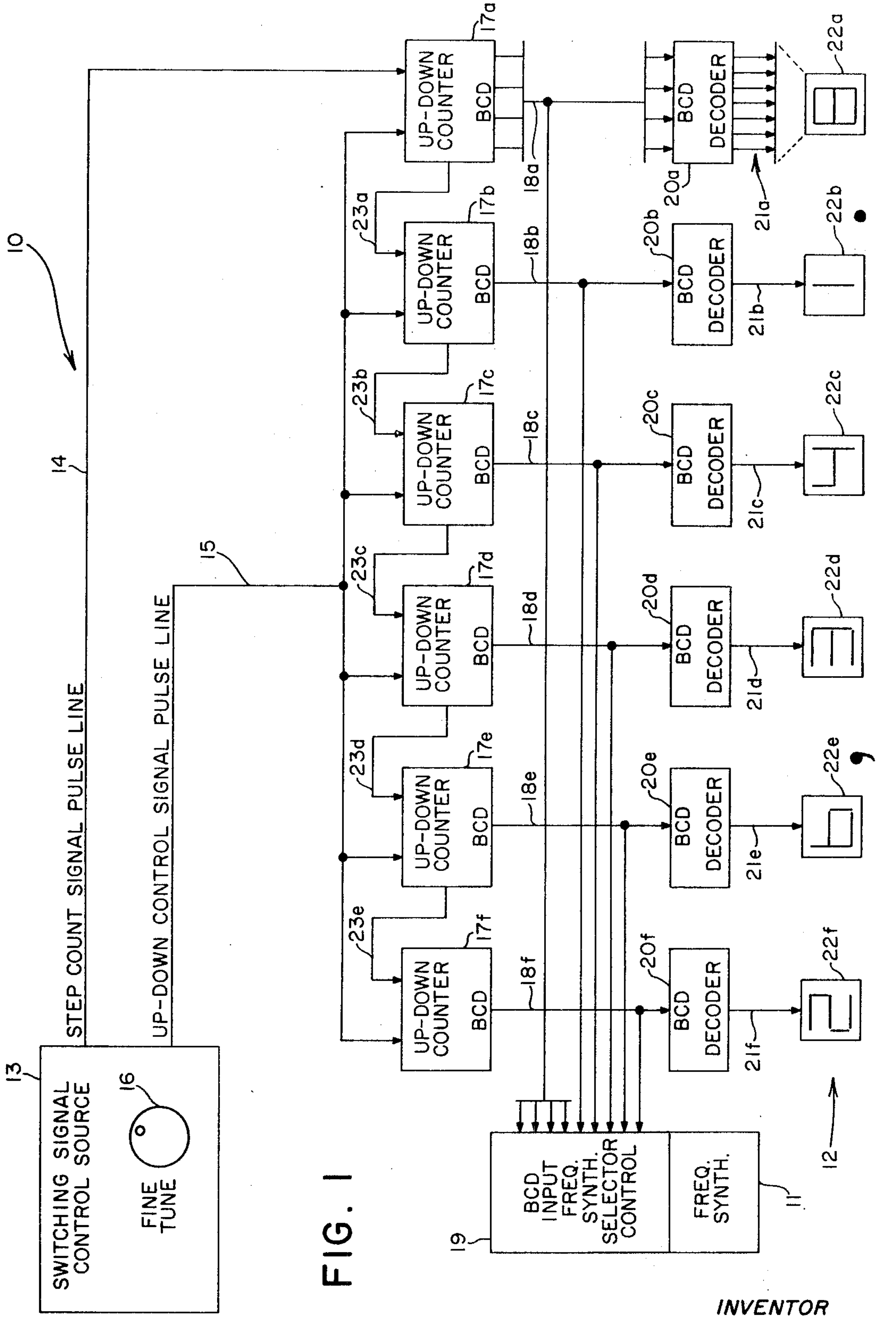

INVENTOR
MAX E. PETERSON
BY Warren H. Kintzinger
ATTORNEY

PROPORTIONAL DIGITAL CONTROL FOR RADIO FREQUENCY SYNTHESIZERS

This invention relates in general to tuning control for radio receivers, and in particular, to a binary-coded-decimal control to a frequency synthesizer tunable in contiguous small interval increasing or decreasing steps for radio receivers or transmitters.

Digital frequency synthesizers such as used for radios generally are not well-suited for scanning receivers since each digit of the operating frequency must be set up individually each time the frequency is changed. More conventionally employed tuning systems with receivers generally utilize a large knob for scanning or tuning across frequency bands. This type of tuning and the tuning feel provided therewith by such more conventionally employed tuning systems is desired but, it is important that the use of a synthesizer with its inherent benefits not be sacrificed. This has led to various compromise approaches on the part of various manufacturers with, for example, many synthesized receivers being tuned in discrete accurate bands through, for example 100 kHz, or for that matter, a band with 1 MHz, etc., but with scan or tuning employed within these bandwidths with a variable oscillator. Obviously, the frequency stability of this type of oscillator tuning control within an operational frequency band cannot match that attained with a synthesized oscillator making such a variable oscillator tuned receiver particularly unsuitable for data communications. Furthermore, with such variable oscillator tuning systems, there are problems in interpolating or reading analogue tuning scales, and then some receivers providing a digital readout of the operating frequency utilize a system of readout that is nothing more than a frequency counter measuring the frequency of a variable oscillator in the tuning system. With this latter system an unstable variable oscillator is still used and with most frequency counters the accuracy of the last, or least significant, digit is generally suspect. Furthermore, the readout with such systems is subject to undesired blinking, cycling, or change after a frequency is selected and is a significant problem.

It is, therefore, a principal object of this invention to provide a radio tuning system with tuning phase-locked in 100 Hz steps without sacrificing the convenience and "feel" of traditional receiver tuning.

Another object with such small incremental step phase-locked tuning is remote tuning control from a remote control head or by computer programming.

A further object is to provide a frequency readout display with such step phase-locked tuning that is not subject to undesired blinking, cycling or change after a frequency is selected.

Another object is to provide such a small incremental step tuning phase-locked system for radios with band switching when desired spanning great multiples of the small incremental step tuning and with all tuning and band switching performed electronically.

Still another object is to provide in such an incremental step phase-locked tuning system a multidigit system with, for individual digits, an up-down counter to four wire binary-coded-decimal system to a BCD input frequency synthesizer connection and respective integer display BCD decoder interconnect circuits.

Features of the invention useful in accomplishing the above objects include, in a proportional digital control system for radio frequency synthesizers, a switching signal control source with a fine tune dial with, in the system, tuning phase-locked in 100 Hz steps without sacrificing the convenience and feel of traditional receiver tuning. This is with the fine tuning dial generating a two signal output via appropriate circuitry with one a step count signal pulse line and the other an up-down control signal pulse line. The signals for these two lines are generated only upon rotation of the tuning dial with the signal pulse rates thereof directly related to the rate of dial turning, and with the pulse signals on the up-down control signal pulse line being up or down count control signals as determined by their phase relationship to signal pulses on the step count signal pulse line in accord with the direction of rotation of the tuning dial. The two signal lines activate a chain of up-down counters to BCD four wire output counter circuits that have connections directly to BCD input frequency synthesizer selector control circuitry of a frequency synthesizer and also as four wire BCD input connections to respective BCD decoder circuits that are respectively connected to individual digit readout display devices for the respective digits of a multidecade display number. In a working embodiment there are six up-down counters, one for each digit of the operating frequency, that add or substract pulses to change the operating frequency. For example, assuming the six counters have accumulated a total of 192,465 input pulses with each pulse carrying the weight of the least significant digit, in this case 100, the number stored or accumulated in the six counters represents an operating frequency 19.2465 MHz. With this embodiment the value of the least significant digit displayed is the minimum frequency change of the associated frequency synthesizer.

A specific embodiment representing what is presently regarded as the best mode of carrying out the invention is illustrated in the accompanying drawings.

Figure 2A:
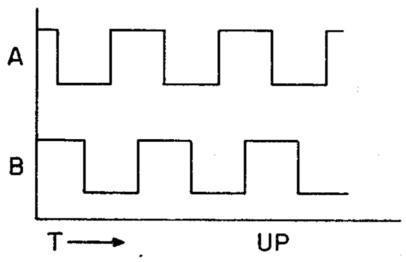
Figure 2B:
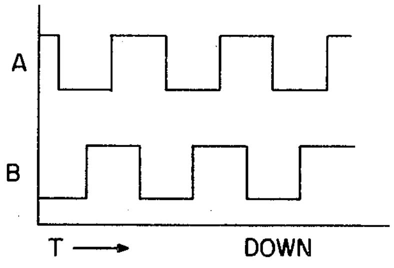
Figure 7:
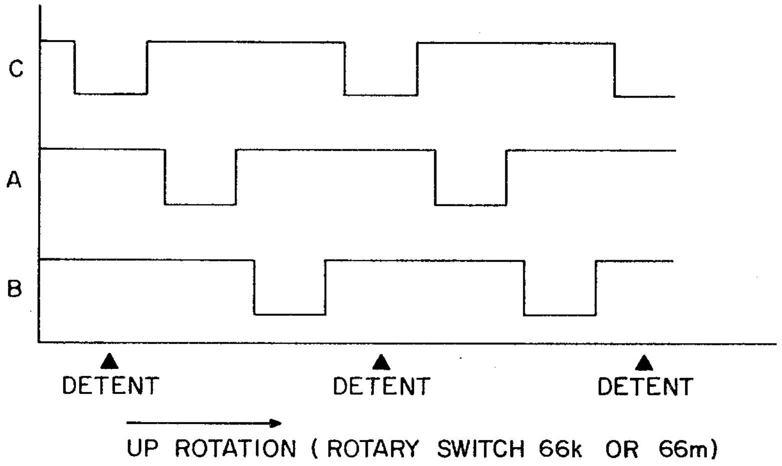
Figure 3:
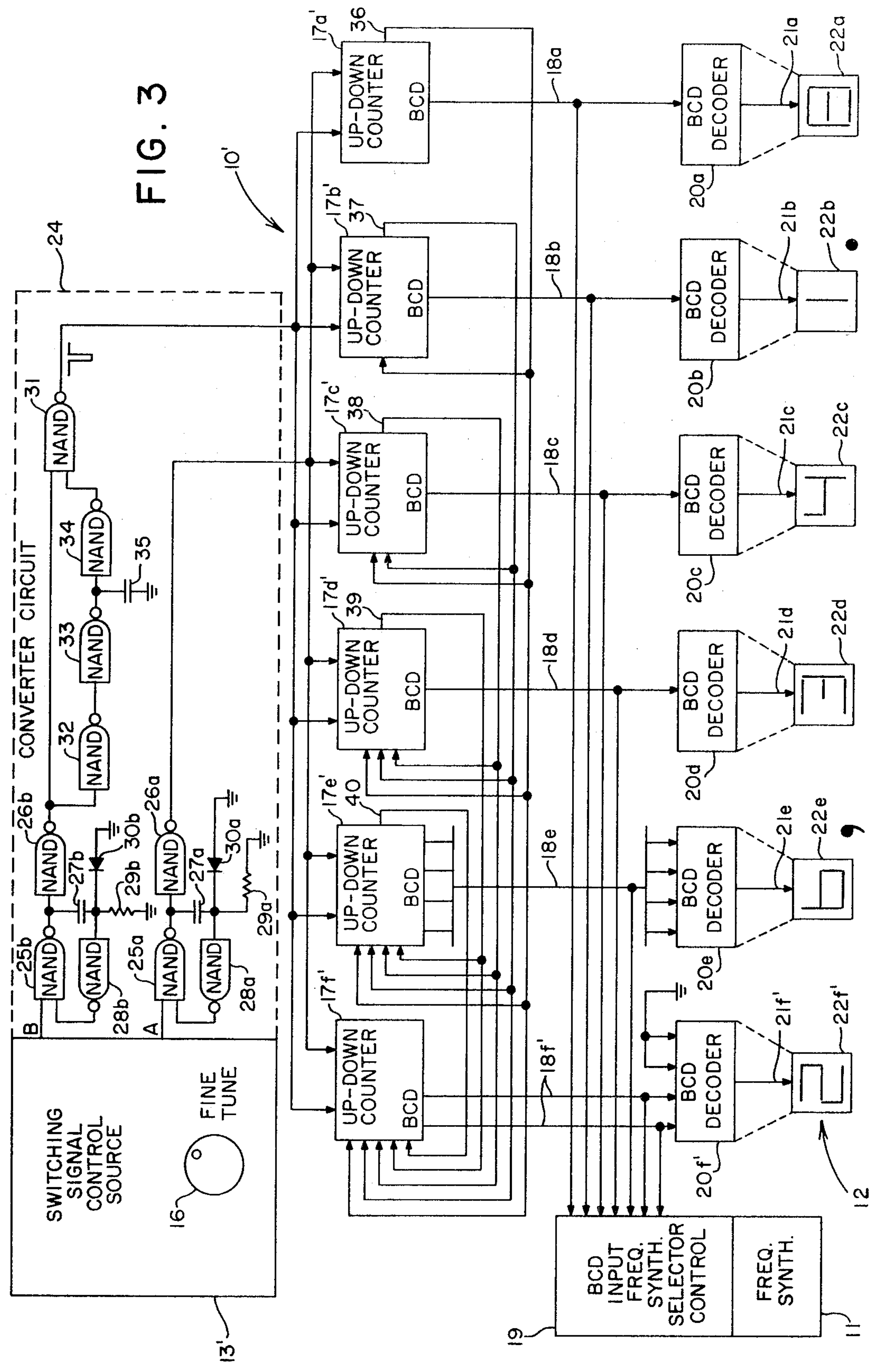
Figure 5:
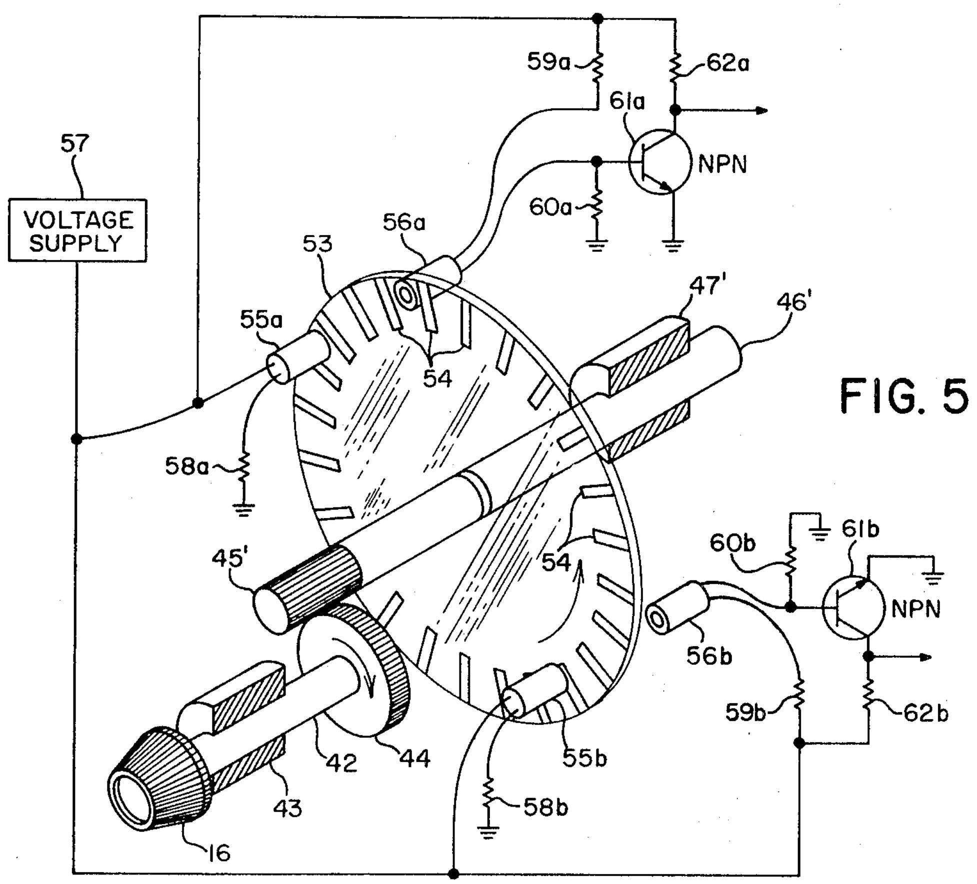
Figure 4:
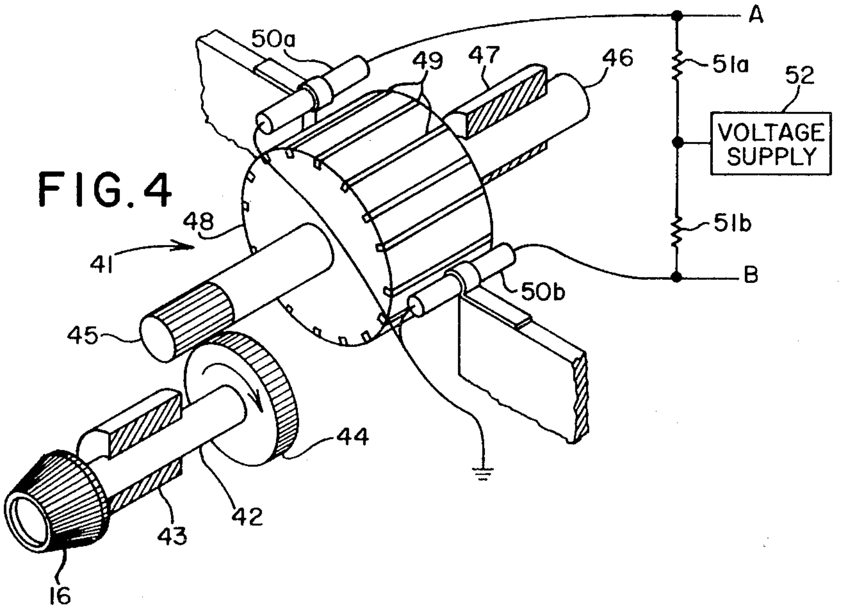
Figure 6:
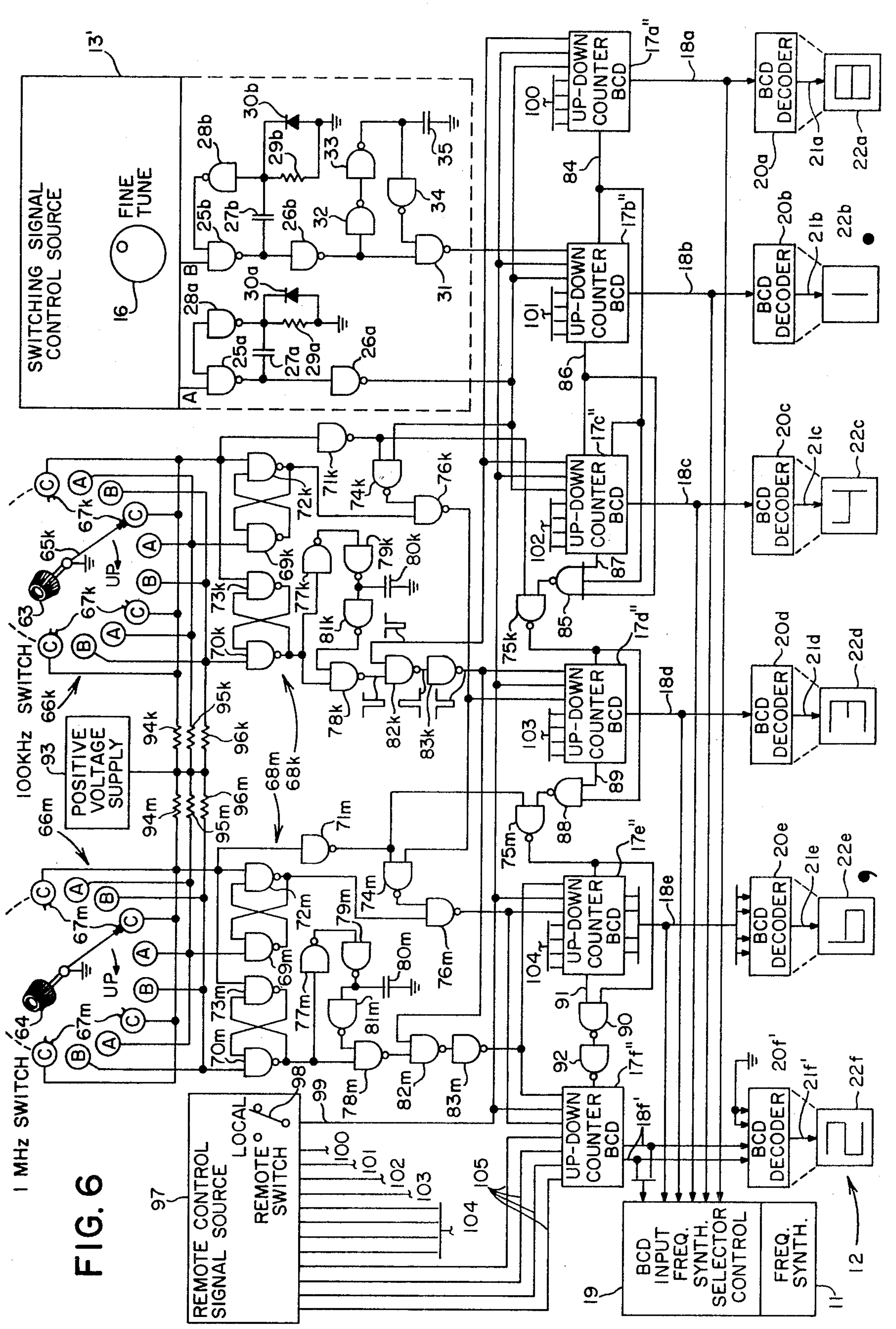

In the drawings:

FIG. 1 represents a general block schematic diagram of applicant's proportional digital control system for radio frequency synthesizers with fine tuning phase-locked in relatively small uniform incremental steps;

FIGS. 2*a* and 2*b* square wave waveforms generated with rotation of the tuning dial of FIG. 1 with the two square waves staggered in phase by 90° with the phase relationship of 2*a* for an up count with clockwise rotation of the fine tune knob and with the opposite phase relationship of 2*b* developed for a down count with counter clockwise rotation of the fine tune knob;

FIG. 3, another block schematic showing of a proportional digital control system for radio frequency synthesizers similar in many respects to that of FIG. 1 with converter circuit detail added and with a different system of digit carry-over;

FIG. 4, a partial perspective view of a magnetic drum switch with two reed relay contacts associated therewith that may be employed in the embodiments of FIGS. 1 and 3 in the switching signal control source with the magnetic drum driven by the fine tuning knob for developing the a and b output waveforms of FIGS. 2 *a* and 2*b* as determined by direction of rotation of the tuning knob and the magnetic drum driven thereby;

FIG. 5, an alternate switch driven by the fine tuning knob that may be used in the embodiments of FIGS. 1 and 3 in place of the magnetic drum switch of FIG. 4 with this switch in the form of a photoelectric type rotary switch;

FIG. 6, a general block diagram of applicant's proportional digital control system for radio frequency synthesizers with fine tuning phase-locked in relatively small uniform incremental steps with additional tuning knobs including a 100 kHz control knob and a 1 MHz control knob and with the four wire BCD signals not only controlling the frequency synthesizers but through BCD decoders providing direct digital frequency readouts; and FIG. 7, square wave waveforms generated with up count clockwise rotation of the 100 kHz or 1 MHz control knob switches of FIG. 6.

Referring to the drawings:

The proportional digital control system 10, of FIG. 1, for a radio frequency synthesizer 11, with fine tuning phase locked in relatively small uniform incremental steps, and equipped with a digital frequency readout display 12, is shown to have two signal paths extended from switching signal control source 13. The two signal paths, step count signal pulse line 14 and up-down control signal pulse line 15, extend from the switching signal control source 13, that includes a fine tune control knob 16 driving switch means, not shown in FIG. 1, for developing the two outputs on lines 14 and 15. The lines 14 and 15 are input connected to up-down counter 17*a*, that counts 0 to 9 and successively recycles in progressive up counts and accomplished the reverse with down counts, and converts the count therefrom to a BCD four wire output connection 18*a* for the significant digit location. Line 15 from the switching signal control source is connected not only as an input to the up-down counter 17*a* but also to all of the other up-down counters 17*b*, 17*c*, 17*d*, 17*e*, and 17*f*. The four wire BCD output 18a of up-down counter 17*a* is applied both as a four wire BCD input to BCD input frequency synthesizer selector control circuit 19 and also as a four wire BCD input wire to BCD decoder circuit 20*a* that is shown to have a seven line output interconnect 21*a* to a seven bar numeric readout display device 22*a* for providing a 0 through 9 digit readout at the least significant digit location that may be a TUNG-sol digivac seven bar numeric readout. Obviously, a Nixie tube type digit readout device could be employed in place of the seven bar numeric device 22*a* with an appropriate line interconnect from the BCD decoder 20*a*.

With each 0 through 9 cycle count back to 0 of up-down counter 17*a*, a one count is transmitted through line 23*a* from up-down counter 17*a*, as an input to up-down counter 17*b* that with each one count so transmitted thereto, coincident with continuing up count input from the line 15 connection as an input directly thereto gives one count in the 0 through 9 count of that particular up-down counter 17*b*. The serially successive higher up-down counters 17*c*, 17*d*, 17*e*, and 17*f* via the interconnects as inputs from the next lower up-down counter through line connections 23*b*, 23*c*, 23*d*, and 23*e* just as with the interconnect 23*a* to up-down counter 17*b* provide the same functional operation in conversions thereof to BCD four wire outputs via line connections 18*b*, 18*c*, 18*d*, 18*e*, and 18*f*. These are connected as four wire BCD connections to the BCD input frequency synthesizer selector control circuit 19 just as is done with the four wire BCD connection 18*a* from up-down counter 17*a* and also to the BCD decoder circuits 20*b*, 20*c*, 20*d*, 20*e*, and 20*f* just as four wire connection 18*a* is input connected to BCD decoder 20*a*. Furthermore, seven line output interconnects 21*b*, 21*c*, 21*d*, 21*e*, and 21 *f* interconnect the respective BCD decoders 20*b*, 20*c*, 20*d*, 20*e*, and 20*f* to the respective seven bar numeric readout display devices 22*b*, 22*c*, 22*d*, 22*e*, and 22*f* just as 21*a* interconnects the BCD decoder 20*a* and the seven bar numeric readout display device 22*a*.

Thus, the step count signal pulse line 14 and the up-down control signal pulse line carrying signals in response to rotation of the fine tune knob 16 as rate determined thereby and phase related for up count or down count, up count with clockwise rotation and down count with counterclockwise rotation. These are the resulting signals out of switching signal control source 13 that drive six up-down BCD (binary-coded decimal) counters 17*a* through 17*f* that in turn drive six BCD to seven bar decoders 20*a* through 20*f* that operate six seven bar numeric readouts 22*a* through 22*f*, respectively. The output of each up-down counter is passed through four lines that pass the counter stored BCD equivalent of the number of pulses counted by each counter 17*a* through 17*f* as the BCD informational input controlling the frequency of the digital frequency synthesizer 11 that determines the particular frequency the receiver is tuned to. While there are six up-down counters shown, one for each digit of the operating frequency that add (up count) or subtract (down count) pulses to change the operating frequency there could be frequency control systems with more or less than six up-down counters for a particular system of interest. With reference to the six counter tuning control system 10 shown and assuming the six counters have accumulated a total of192,465 input pulses, since each pulse carries the weight of the least significant digit, in this particular example 100 Hz, the number stored or accumulated in the six counters represents an operating frequency of 19.2465 MHz. This is with the value of the least significant digit displayed constituting the minimum frequency change of the associated frequency synthesizer.

The number of pulses stored in the six counters is changed by adding or subtracting input pulses by rotation of the "fine tune" knob 16 one direction or the other. This generates a series of pulses such as shown in FIGS. 2A or 2B consisting of two square wave waveforms staggered in phase by 90° one way or the other as determined by a direction of rotation of knob 16. With clockwise rotation of knob 16 to increase the operating frequency, waveforms A and B with a phase relationship of FIG. 2*a* are developed with waveform A the up-down control signal pulse waveform and waveform B the step count signal pulse waveform. With counterclockwise rotation of knob 16, the same corresponding waveforms A and B of FIG. 2*b* assume the reverse phase relation for the down count mode of operation.

With reference to the proportional digital control system 10′ of FIG. 3, a converter circuit 24 is included with the switching signal control source 13′. In converter circuit 24 the up-down control line A is connected as an input to NAND gate 25*a* and the output of NAND gate 25*a* is connected as an input to NAND gate 26*a* having an output connection as an input to the up-down counters 17*a*′ through 17*f*′. The output of NAND gate 25*a* to input of NAND gate 26*a* junction is connected through capacitor 27*a* to the input of NAND gate 28*a* having an output connection as a second input to NAND gate 25*a*. Further, the junction of capacitor 27*a* and NAND gate 28*a* is connected through resistor 29*a* and diode 30*a*, in parallel, to ground with the diode having a cathode connection to the junction of capacitor 27*a*, resistor 29*a*, and NAND gate 28*a*, and anode to ground. The step count signal pulse waveform B line from switching signal control source 13′ is connected as an input to NAND gate 25*b* having an output connection as an input to NAND gate 26*b*. The output of NAND gate 25*b* to input of NAND gate 26*b* junction is connected through capacitor 27*b* to the input of NAND gate 28*b* having an output connection as a second input to NAND gate 25*b*. Further, the junction of capacitor 27*b* and NAND gate 28*b* is connected through resistor 29*b* and diode 30*b*, in parallel, to ground with the diode having a cathode connection to the junction of capacitor 27*b*, resistor 29*b*, and NAND gate 28*b*, and anode to ground. The output of NAND gate 26*b* is connected as an input both to NAND gate 31 and NAND gate 32. The output of NAND gate 32 is connected as an input to NAND gate 33 having an output connection both through capacitor 35 to ground and as an input to NAND gate 34 with an output connection as a second input to the NAND gate 31. The output of NAND gate 31 is connected as the step count signal input to the up-down counters 17*a*′ through 17*f*′.

In the embodiment of FIG. 3, both the A and B signal lines through the converter circuit with switching signal control source 13′ are connected as dual inputs to all of the up-down counter circuits 17*a*′ *through 17f*′. Please note that where components are the same as in the embodiment of FIg. 1, they are numbered the same and where they are similar in function but with some differences, they are primed, while entirely new components are given new numbers as a matter of convenience. Each of the four wire BCD lines 18*a* through 18*e* along with two BCD lines 18*f*′ from up-down to BCD counter circuit 17*f*′ are connected both to the BCD input frequency synthesizer selector control 19 and also to the respective BCD decoder circuits 20*a* through 20*e* and 20*f*′ with each of these driving through suitable interconnect the digit display units 22*a* through 22*e* and 22*f*′ with the BCD decoder 20*f*′ and the display digit unit 22*f*′ being different from their counterparts at other digit locations in that they are wired to display only 0, 1, and 2. Please note further, that two of the inputs of the BCD decoder circuit 20*f*′ are grounded in order to provide the proper desired decoded count out of BCD decoder in driving the display device 22*f*′ through its count of 0, 1, and 2, up or down as the case may be. Please note further that up-down counter to BCD output circuit 17*a*′ is provided with an additional output line 36 that is connected as a higher level input to all the higher level up-down counter to BCD circuits 17*b*′ through 17*f*′. In like manner, up-down counter to BCD circuit 17b' is provided with an output line 37 that is in turn connected to all of the higher level up-down counter to BCD circuits 17c' through 17f' as inputs thereto in parallel with the inputs from line 36 from up-down counter circuit 17a'. In like manner an output line 38 from up-down counter 17c' is connected as an input to up-down counter circuits 17b' and 17e' and 17f'. The output line 39 of up-down to BCD circuit 17d' is also connected to up-down counter circuits 17e' and 17f'; and finally, the output line 40 of up-down counter circuit 17e' is connected as an additional input to up-down counter circuit 17f'.

Referring now to FIG. 4, a magnetic drum switch assembly 41 is shown that may be used in the switching signal control source 13 of FIG. 1 or in the switching signal control source 13' of the FIG. 3 embodiment for developing the square wave A and B waveforms of FIG. 2a with clockwise rotation of the tuning knob and the square wave A and B waveforms of FIG. 2b with counterclockwise rotation of the tuning knob 16. The tuning knob 16 is shown to be mounted on a shaft 42 extended through a bearing support 43 to drive gear 44 that in turn meshes with a smaller gear 45 extension of magnet drum shaft 46 rotatably mounted by bearing 47 for driven rotation of the magnetic drum 48 either in a clockwise direction or counterclockwise direction as desired by the turning of tuning knob 16. The magnetic drum 48 is equipped with a plurality of mutually spaced bar magnets 49 that are substantiajly equally mutually spaced about the drum 48. This coupled with carefully selected positioning of reed relay contacts 50a and 50b, both radial distance wise, and particularly circumferential location wise is such, with connection of one end terminal of the reed relay contacts 50a and 50b to ground and the other reed relay contacts through resistors 51a and 51b, respectively, to voltage supply 52, that in a working embodiment is a positive 5 volt supply, to develop the A and B waveforms of FIGS. 2A and 2B and on the A and B line connections dependent on tuning knob 16 and drum 48 directions of rotation.

An alternate approach to the magnetic drum switch assembly 41 of FIG. 4 is shown in FIG. 5 wherein a transparent material disc 53 is mounted on a shaft 46' driven in counterclockwise or clockwise rotation by rotation of tuning knob 16 just as the magnetic drum 48 is turned in rotation by the tuning knob 16 of FIG. 4. In the embodiment of FIG. 5, radially extended mutually equally spaced opaque slots 54 are provided on the transparent material disc 53 that serve to interrupt beams of light emanating from light sources 55a and 55b that are otherwise received and detected by light detectors 56a and 56b. Both of the light sources 55a and 55b have one terminal connected to voltage supply 57, and the other terminal of each light source 55a and 55b is connected through, respectively, resistors 58a and 58b to ground. With respect to the light detectors 56a and 56b, one terminal of each is connected, respectively, through resistors 59a and 59b to voltage supply 57 while the other terminals thereof are connected respectively through resistors 60a and 60b to ground and also to the bases of NPN transistors 61a and 61b. Both of the NPN transistors 61a and 61b have their emitters connected to ground and the collectors thereof through resistors 62a and 62b to the positive voltage supply 57 and also to the A and B output lines, respectively.

Please note that with respect to the A and B waveform developing switch embodiments of FIGS. 4 and 5 that there is such switch contact bounce inherent with the magnetic drum switch embodiment of FIG. 4 that the converter circuit 24, shown in FIG. 3, is required for proper fine tuning operation of applicant's proportional digital control systems for radio frequency synthesizers. However, it should be noted that with the electronic switch approach of FIG. 5 that the transition switching accomplished therewith through the switching threshold regions is sufficiently sharp and definite that the converter circuit 24 may be dispensed with and the FIGS. 2A and 2B type waveforms generated with the electronic switch of FIG. 5 may be applied directly to up-down counters in applicant's proportional digital control systems for radio frequency synthesizers. In any event the A and B input lines to converter circuit 24 are two square waves staggered in phase generally by approximately 90° one way or the other as determined by the direction of rotation of fine tune knob 16. The two resulting outputs from the converter circuit 24, shown in FIGS. 3 and 6, and that may be included with the embodiment of FIG. 1 as a part of the switching signal control source circuit 13, are, respectively, a reference pulse that is more properly referred to as a reference pulse waveform than a clock pulse waveform since its pulse repetition rate is determined directly by the rate of turning of fine tune knob 16, and an up-down control pulse waveform. When the fine tune knob 16 is rotated clockwise to increase the operating frequency with waveforms A and B, as shown in FIG. 2A for the up count state being generated, the up-down output of the converter circuit 24 switches to a logic 1 and then subsequently a reference pulse is generated. With counterclockwise rotation of fine tune knob 16, A and B waveforms, such as illustrated in FIG. 2B, are generated with the up-down output first switching to a logic of 0 and then a reference pulse being generated.

When the A waveform input line to converter circuit 24 goes to a logic 1, the output of NAND gate 25a goes to a logic 0 and the output of NAND gate 26a goes to a logic 1. With the output of NAND gate 25a at logic 0, capacitor 27a discharges through diode 30a and the output of NAND gate 26a will hold at logic 1 (an up control for the up-down counters that may be Fairchild 9306 up-down counters) as long as the input waveform A line stays at logic 1. With the passage of time, the B waveform input line to converter circuit 24 switches to logic 1 with the output of NAND gate 25b thereupon going to logic 0, the output of NAND gate 26b going to logic 1, and the output of NAND gate 31 going to logic 0. The circuit with NAND gates 31, 32, 33, and 34 and capacitor 35 acts as a one-shot (monostable) multivibrator with when the output of NAND gate 26b is logic 0 the outputs of NAND gates 34 and 31 being at logic 1. Then as the output of NAND gate 26b goes to logic 1, the output of NAND gate 31 goes to logic 0 since the output of NAND gate 34 cannot change immediately due to the effect of capacitor 35 in the circuit. Subsequently, as the output of NAND gate 33 rises to logic 1, the output of NAND gate 34 then goes to logic 0 and the output of NAND gate 31 then returns to logic 1 independent of the output of NAND gate 26b. The capacity of capacitor 35 is a determinate factor in establishment of the width of the reference pulse out of NAND gate 31. When the A and B inputs to converter circuit 24 each return to logic 0, the sequence is ready to start again. There are several ways that the A and B waveforms may be generated but especially if relay contacts are used, contact bounce can be a problem. This arises when the contacts close in a logic 1 to 0 transition in that they tend to bounce thereby creating extraneous pulses. In order to take care of this problem, resistor 29a, capacitor 27a, and NAND gate 28a are provided in the waveform A circuit, and resistor 29b, capacitor 27b, and NAND gate 28b are provided in the waveform B circuit. When the waveform A input switches to logic 0, the output of NAND gate 25a goes to logic 1, charging capacitor 27a through resistor 29a. The voltage across the resistor 29a looks like a logic 1 so the output of NAND gate 28a switches to logic 0 thereby holding the output of NAND gate 25a at logic 1 until any tendency of continued relay bounce is over on the waveform A input line. Please note that resistors 29a and 29b are small enough that the NAND gates 28a and 28b see a logic 0 when the capacitors 27a and 27b are not charging.

The design of the particular up-down counters, such as up-down counters 17a' through 17f' employed in the FIG. 3 embodiment, will vary with the integrated circuits selected. Further, the seven bar decoder circuits 20a through 20e and 20f are discrete integrated circuits and their selection depends upon the type of numeric readout employed. Working embodiments in accord with the FIG. 3 showing have been built using Fairchild 9306 up-down counters, Fairchild 9327 decoders and Tung-Sol Digivac seven bar numeric readouts.

There is one drawback, however, with the embodiment of FIg. 3. Assuming that the fine tune know 16 generates 100 clock pulses per revolution and that to increase the operating frequency from 0 to 15 MHz, 150,000 clock pulses are required, or 1,500 revolutions of the fine tune knob 16. With this being somewhat impractical, the circuit of FIg. 3 has been modified to the embodiment of FIG. 6 with two more tuning knobs added, one a 100 KHz knob 63, and the other a 1 MHz control knob 64. While, in the embodiments of FIGS. 1 and 3, each up-down counter is labeled for the particular digit of the operating frequency that it controls, the 100 KHz control knob 63 of the FIG. 6 embodiment generates a clock pulse and an up-down pulse that is applied only to the 100 KHz and serially higher decades. In a similar manner, the 1 MHz control knob 64 generates a control pulse and an up-down pulse applied to only the 1 and 10 MHz decades. This is with both the control knob 63 and control knob 64 associated circuits identical other than their being connected at their respective serial locations with respect to decade locations.

The control knob 63 is connected for rotating a grounded contact switch arm 65k that makes contact successively with A, B, and C contacts in A, B, C, A, B, C, A, B, C order with clockwise rotation and in reverse contact successively C, B, A, C, B, A with counterclockwise rotation of the rotatable switch contact arm **65*k* through the entire range of A, B, C contacts in the rotary switch 66*k*. A detent structure 67*k* is provided at each C contact of the rotary switch 66*k* in order that the switch contact arm 65*k* may rest on the switch C contacts in the detent positions. With the rotary contact arm 65*k* grounded, contact C, that is all the C contacts since they are interconnected are always at ground or logic 0 unless the switch arm 65*k* is rotated by the knob 63 away from a detent C terminal contact. As has been pointed out hereinbefore, it is important to maintain the continuous tuning effect anywhere within the frequency tuning range of the receiver. For example, if all six of the readouts indicate 0, that is 00.0000 MHz, the reading will change to 00.0001 MHz or 29.9999 MHz by moving the fine tune knob 16 a fraction of a turn counterclockwise "up" or counterclockwise "down." Therefore, the switch 66*k* associated circuitry 68*k* has a composite up-down output and a reference pulse waveform output that consists of signals generated from the switching signal control source 13' with rotation of fine tune knob 16 as passed through converter circuit 24 and those generated by the rotary switch 66*k***.

In the switch **66*k* associated circuit 68*k*, the circuit interconnected A contacts of rotary switch 66*k* are connected as an input to NAND gate 69*k*, the interconnected B switch contacts are connected as an input to NAND gate 70*k*, and the circuit interconnected detent 67*k* equipped C contacts of rotary switch 66*k* are connected as inputs to NAND gates 71*k*, 72*k*, and 73*k*. The output of NAND gate 71*k* is connected as an input to NAND gate 74*k* that receives as another input the up-down output of converter circuit 24. It should be noted that the output of NAND gate 71*k* is also connected as an input to NAND gate 75*k* that has an output connection as an input to up-down counter 17*d''* in the up-down counter circuit section of the control system. The output of NAND gate 74*k* is connected as an input to NAND gate 76*k* that also has an input connection from the output of NAND gate 72*k*. The output of NAND gate 69*k* is connected back as an additional input to NAND gate 72*k* and the output of NAND gate 72*k*, in addition to its connection to NAND gate 76*k*, is also connected back as an additional input to NAND gate 69*k*. The output of NAND gate 76*k* that is a composite of the up-down signal from converter circuit 24 and that derived from switching of rotary switch 66*k* is connected both as an input to up-down counter 17*d''* and also as an additional input to NAND gate 74*m* of the circuit 68*m* associated with the 1 MHz rotary switch 66*m*. The output of NAND gate 73*k* is connected back as an input to NAND gate 70*k* and the output of NAND gate 70*k* is connected back as an input to NAND gate 73*k*. The output of NAND gate 70*k* is also connected both to NAND gate 77*k* and NAND gate 78*k*. The output of NAND gate 77*k* is connected as an input to NAND gate 79*k* having an output connection both through capacitor 80*k* to ground and also as an input to NAND gate 81*k*. The output of NAND gate 81k is connected also as an additional input to NAND gate 78*k*. The output in turn of NAND gate 78*k* is connected as an input to NAND gate 82*k* that also receives a reference pulse waveform input connection from the converter circuit 24. The output of NAND gate 82*k* is connected as an input to NAND gate 83*k* and the resulting composite reference output therefrom is connected both as an input to up-down counter 17*d''* and also as an input to NAND gate 82*m* in circuit 68*m* associated with rotary switch 66*m***.

Please note that other than for differences hereinbefore pointed out and a few more, the circuitry 68m associated with rotary switch **66*m* of the 1 MHz switching control knob 64 is very much the same component wise and in operational functioning as with the circuit 68*k* associated with rotary switch 66*k* of control knob 63 used for tuning by 100 kHz steps. With this being the case, components in the 68*m* circuit that are duplicates of those in the 68*k*** circuit carry the same numbers with an *m* designation as opposed to a *k* designation with the **68*k* circuit as a matter of convenience. In the circuit 68*m* associated with rotary switch 66*m*, the output of NAND gate 76*m* is connected as an up-down input to both up-down counters 17*e''* and 17*f'*, the output of NAND gate 83*m* is connected as a reference pulse input to both the up-down counter circuits 17*e''* and 17*f'*, and the output of NAND gate 71*m* in addition to being connected as an input to NAND gate 74*m* is connected as an input to NAND gate 75*m* in the up-down counter circuit chain. In the up-down counter circuit chain of the FIG 6 embodiment, an output line 84 of up-down counter circuit 17*a''* is connected as an input to up-down counter circuit 17*b''*, up-down counter 17*c''*, and also as an input to NAND gate 85. OUtput line 86 of up-down counter 17*b''*is connected both as an input to up-down counter 17*c''*and also as an input to the NAND gate 85. Output line 87 of up-down counter 17*c''*is also connected as an additional input to NAND gate 85. The output of NAND gate 85 is connected as an input to NAND gate 75*k* that also receives an additional input from the output of NAND gate 71*k* in the circuit 68k associated with rotary switch 66*k*. The output of NAND gate 75*k* is connected both as an input to up-down counter circuit 17*d''* and also as an input to NAND gate 88 that also receives an additional input via output line 89 of up-down counter 17*d''*. The output of NAND gate 88 is connected as an additional input to NAND gate 75*m* that receives its other input from the output of NAND gate 71*m* in circuit 68*m* associated with rotary switch 66*m*. The output of NAND gate 75*m* is connected both as an input to up-down counter 17*e''* and also as an input to NAND gate 90 that receives an additional input through output line 91 of up-down counter 17*e''*. The output of NAND gate 90 in turn is applied as a sole input to NAND gate 92, the output of which is applied as an input to up-down counter 17*f'*. Thus, cooperative means is provided toward carry-over stepping up and down count from up-down counters to serially higher up-down counters in the up-down counter circuit section of the control system. Furthermore, the rotary switches 66*k* and 66*m* with their associated circuits 68*k* and 68*m*** provide for step changing the count or frequency setting by 100 KHz and 1 MHz steps respectively.

Referring also to the square wave C, A, and B waveforms showing of FIG. 7 with up rotation of either rotary switch **66*k* or 66*m* of FIG. 6, it should be noted that in the detent positions of the interconnected C contacts that all the C contacts are at ground via connection of one C contact through the switch arm 65 to ground. When either of the rotary switches 66*k* or 66*m* are rotated up in frequency setting with clockwise rotation thereof before a contact A is engaged by the switch arm 65 connection with a C contact is broken and the A waveform of FIG. 7 is generated. Then, subsequently, contact of the switch arm 65 with one A contact is broken before engagement with one B contact to ultimately develop the B waveform of FIg. 7. Obviously, a reverse sequence of waveforms would be developed, with down counterclockwise rotation of the rotary switches 66$k$ or 66$m$, from the waveforms shown in FIG. 7. As long as a contact C of rotary switch 66$k$ is grounded, the outputs of NAND gates 71$k$ and 78$k$ are at logic 1 with circuit 68$k$ associated with rotary switch 66$k$ then in condition to respond to up-down and reference pulses of the fine tune via converter circuit 24. As the rotary switch 66$k$ is turned in clockwise rotation up in frequency wit a C contact being broken from ground before a contact A is closed, the output of NAND gate 71$k$ goes to a logic 0, forcing NAND gate 74$k$ to a logic 1 state. This makes the output of NAND gate 76$k$ independent of the input up-down signal from converter circuit 24 applied to NAND gate 74$k$. When a contact A is grounded by engagement of arm 65$k$ with one of the A contacts, the output of NAND gate 72$k$ switches to logic 0 forcing NAND gate 76$k$ back to logic 1, the desired output for the up direction. This logic level remains at the output of NAND gate 76$k$ until a contact C is again grounded. However, before this condition occurs with continued clockwise rotation of the switch arm 65$k$ contact B is engaged by the arm 65 and taken to ground. This results in the output of NAND gate 70$k$ going to logic 1, and generation of negative pulses out of NAND gate 78$k$ and NAND gate 83$k$. Since the reference pulse signal from converter circuit 24 and the output of NAND gate 78$k$ are at logic 1 most of the time when either one switches to logic 0, the resulting reference output out of NAND gate 83$k$ will follow. Obviously, the circuit 68$m$ associated with rotary switch 66$m$ functions much the same as circuit 68$k$ with up-down signal inputs and reference signal inputs thereto being derived via the circuit 68$k$ rather than with inputs directly from converter circuit 24 as is the case with circuit 68$k$. In order that the square wave waveforms C, A and B, such as shown in FIG. 7, may be developed from, with respect to each, a ground potential at their lower levels to a positive voltage level, a positive voltage supply 93 is connected through resistor 94$k$ to the C contacts, resistor 95$k$ to the A contacts, and 96$k$ to the B contacts of the rotary switch 66$k$, and in like manner with the positive voltage supply 93 connected through resistors 94$m$, 95$m$, and 96$m$ to the C, A and B contacts, respectively, of rotary switch 66**$m$.

While up-down counter to BCD output circuit 17$f'$ has a two wire BCD output for providing 0, 1, 2 count just as with the up-down counter 17$f$ and the two wire 18$f$ output thereof in the FIG. 3 embodiment, the up-down counter 17$f'$ could be instead, if desired, a four wire BCD output counter circuit providing a 0 to 9 count and back to 0 counting action just as with the other up-down counter circuits in the case. Each of the other up-down counter circuits 17$a''$ through 17$e''$ are four wire BCD output counters interconnected to respective BCD decoder circuits that are in turn connected to respective display devices 22$a$ through 22$e$ and also 22$f'$. The BCD outputs of the up-down counters are also BCD inputs to BCD input frequency synthesizer selector control 19 of frequency synthesizer 11 much the same as with the FIG. 3 embodiment.

The control circuit of FIG. 6 has an additional important capability in that it is readily controlled by a remote control signal source 97 equipped with a remote-local selection switch 98 that is connected through a remote-local control line 99 that is connected as an additional enable input to all of the up-down counter circuits 17$a''$ through 17$f''$. The remote control signal source 97 is also equipped with four wire BCD output group lines 100, 101, 102, 103, 104, and 105 that feed remotely determined BCD information into the up-down counter circuits 17$a''$ through 17$f''$, respectively, that automatically track to the BCD informational inputs duplicating them at their BCD outputs when a remote enable signal is applied to the up-down counter circuits 17$a''$ through 17$f''$ via remote local control line 99 from the remote control signal source 97 as controlled by remote-local switch 98. Please note further that, although not shown, the BCD output lines from the up-down counter circuits 17$a''$ through 17$f''$ could have connections extending to the remote control signal source 97 for monitoring during local control of the control system or alternately a double gate system with each individual BCD line that could be employed to provide such remote monitoring of the up-down counter BCD outputs via the lines 100 through 105 to the remote control signal source 97. Further, it is interesting to note that these various control system embodiments could be used to tune most any frequency transmitter or receiver by increasing or decreasing frequency in contiguous uniform small incremental frequency steps, such as contiguous 100 Hz steps, that are paralleled by larger frequency step tuning at higher digit locations. Still further, it could be used as an accumulator to display positive or negative events, or for that matter, it is ideally suited as a control head for remote operation in generating remote control information to be transmitted via three, or more, twisted control lines interconnected as command control to a slave device. In addition the BCD output of this circuit makes possible direct recording of the operating frequency on paper tape, etc., or display on a cathode ray tube printer.

Whereas this invention is herein illustrated and described with respect to several embodiments hereof, it should be realized that various changes may be made without departing from the essential contributions to the art made by the teachings hereof.

I claim:

1. In a proportional digital control system using binary coded decimal control for tuning radio frequency synthesizers: a switching signal control source with reference signal pulse output means, an up-down count signal pulse means with up or down count determined by phase relation to the signal pulses of said reference signal pulse output means, and means for shifting signal pulse phase of said up-down count signal means relative to the reference signal pulses; a circuit chain of a plurality of up-down counter to binary coded decimal output circuit units connected to receive reference signal pulses and up-down count signal pulses, and with carry over interconnect between adjacent digit locations of said up-down counter circuit units; a frequency synthesizer with a BCD input frequency selector control circuit connected to the BCD output of said up-down counter circuit units; and a plurality of digit display devices with BCD signal input circuit means connected individually to receive the BCD output signals of the individual up-down counter circuit units of the respective digit locations.

2. The proportional digital control system of claim 1, wherein said switching signal control source is fine tune means initiating up or down count tuning of said frequency synthesizer in contiguous small interval frequency steps throughout the frequency bandwidth range of operation.

3. The proportional digital control system of claim 2, wherein said fine tune means includes a rotary member with a plurality of sensing circuit interrupting means; drive means for turning said rotary member in clockwise or counterclockwise rotation; first and second sense circuit path interrupting means, with said first sense circuit interrupting means generating a pulse signal reference waveform; and with said second sense circuit interrupting means generating an up or a down count signal pulse waveform as determined by phase relation with said pulse signal reference waveform.

4. The proportional digital control system of claim 3, wherein said first and second sense circuit path interrupting means are magnetic relay switches activated by a plurality of substantially equally spaced bar magnets mounted on said rotary member.

5. The proportional digital control system of claim 3, wherein said first and second sense circuit path interrupting means include two light source means and two light detector means in aligned relation, respectively, and for light to shine through said rotary member; and with said rotary member in the form of a rotatably mounted disc with uniformly spaced opaque slots and transparent areas.

6. The proportional digital control system of claim 3, wherein converter circuit means with switching signal pulse waveform shaping of both the reference signal and the up-down count signal pulse waveforms with said switching signal control source includes R-C time constant delay means with both signal paths through said converter circuit means for resolving any switching threshold transition irregularities.

7. The proportional digital control system of claim 3, wherein band switching circuit means is connected to said circuit chain of up-down counter units paralleling said carry over circuitry in at least one location in said circuit chain.

8. The proportional digital control system of claim 7, wherein said contiguous small interval frequency steps are 100 Hz steps; and a plurality of said up-down counter units are 0 to 9 and back to 0 count units with four wire BCD outputs.

9. The proportional digital control system of claim 8 wherein a first section of said band switching circuit means is connected at a 100 kHz band switching location in said circuit chain of up-down counter units; and a second section of said band switching circuit means is connected at a 1 MHz band switching location in said circuit chain of up-down counter units.

10. The proportional digital control system of claim 9, wherein the highest digit up-down counter to BCD output unit is a 0, 1 and 2 back to 0 count unit with two BCD output lines connected both to said BCD input frequency selector control circuit of the frequency synthesizer and to the BCD input circuit means of the digit display device at the highest digit location.

11. The proportional digital control system of claim 7, wherein a plurality of said up-down counter units are provided with independent four wire inputs as information input tracking response inputs to the respective up-down counter units; and an enable signal input to each of the plurality of said up-down counter units responsive, with signal voltage applied thereto from a control location, to enable the up-down counter units to a tracking mode responsively setting to the signals input via said independent four wire inputs respective to each up-down counter unit from a control location.

12. The proportional digital control system of claim 3, wherein each of said plurality of up-down counter units is connected to receive reference signal pulses and up-down count signal pulses; and carry over signal gating connected circuitry in said circuit chain of up-down counter units.

* * * * *